(12) United States Patent
Sato et al.

(10) Patent No.: US 9,401,644 B2
(45) Date of Patent: Jul. 26, 2016

(54) TRENCH MOSFET HAVING AN INDEPENDENT COUPLED ELEMENT IN A TRENCH

(71) Applicant: Renesas Electronics America Inc., Santa Clara, CA (US)

(72) Inventors: Tetsuo Sato, San Jose, CA (US); Tomoaki Uno, Gunma-ken (JP); Hirokazu Kato, Gunma-ken (JP); Nobuyoshi Matsuura, Takasaki (JP)

(73) Assignee: Renesas Electronics America Inc., Santa Clara, CA (US)

( * ) Notice: Subject to any disclaimer, the term of this patent is extended or adjusted under 35 U.S.C. 154(b) by 0 days.

(21) Appl. No.: 14/666,503

(22) Filed: Mar. 24, 2015

(65) Prior Publication Data

US 2015/0194894 A1   Jul. 9, 2015

Related U.S. Application Data

(62) Division of application No. 13/617,744, filed on Sep. 14, 2012, now Pat. No. 9,000,497.

(51) Int. Cl.

| | |
|---|---|
| *H01L 29/76* | (2006.01) |
| *H01L 29/66* | (2006.01) |
| *H01L 21/02* | (2006.01) |
| *H01L 21/31* | (2006.01) |
| *H02M 3/158* | (2006.01) |
| *H01L 29/40* | (2006.01) |
| *H01L 29/417* | (2006.01) |
| *H01L 29/78* | (2006.01) |
| *H01L 27/06* | (2006.01) |
| *H01L 49/02* | (2006.01) |
| *H02M 1/44* | (2007.01) |
| *H03K 17/16* | (2006.01) |
| *H03K 17/687* | (2006.01) |

(52) U.S. Cl.
CPC ........... *H02M 3/158* (2013.01); *H01L 27/0629* (2013.01); *H01L 28/10* (2013.01); *H01L 29/407* (2013.01); *H01L 29/41766* (2013.01); *H01L 29/7813* (2013.01); *H03K 17/165* (2013.01); *H02M 1/44* (2013.01); *H03K 17/162* (2013.01); *H03K 2017/6878* (2013.01); *H03K 2217/0036* (2013.01)

(58) Field of Classification Search
CPC ................ H01L 29/7833; H01L 29/78; H01L 29/41766; H01L 29/7813; H01L 27/0629; H01L 28/10; H01L 29/407; H03K 17/165; H03K 2017/6878; H02M 1/44
USPC .......... 257/288, 334, 723, 632, 411; 323/271, 323/282; 438/765
See application file for complete search history.

(56) References Cited

U.S. PATENT DOCUMENTS

| | | | |
|---|---|---|---|
| 2005/0029584 A1* | 2/2005 | Shiraishi ............. | H01L 29/1095 257/329 |
| 2005/0110475 A1* | 5/2005 | Chapuis .................. | H02M 1/38 323/282 |
| 2006/0273379 A1* | 12/2006 | Bhalla ................. | H01L 29/7813 257/330 |

(Continued)

*Primary Examiner* — Long K Tran
*Assistant Examiner* — Dzung Tran
(74) *Attorney, Agent, or Firm* — Campbell Stephenson LLP

(57) ABSTRACT

A trench MOSFET is disclosed that includes a semiconductor substrate having a vertically oriented trench containing a gate. The trench MOSFET further includes a source, a drain, and a conductive element. The conductive element, like the gate is contained in the trench, and extends between the gate and a bottom of the trench. The conductive element is electrically isolated from the source, the gate, and the drain. When employed in a device such as a DC-DC converter, the trench MOSFET may reduce power losses and electrical and electromagnetic noise.

17 Claims, 13 Drawing Sheets

(56) References Cited

U.S. PATENT DOCUMENTS

| | | | |
|---|---|---|---|
| 2007/0037327 A1* | 2/2007 | Herrick | H01L 29/407 438/151 |
| 2010/0059797 A1* | 3/2010 | Ngai | H01L 21/6835 257/255 |
| 2011/0163732 A1* | 7/2011 | Sapp | H01L 29/407 323/282 |

* cited by examiner

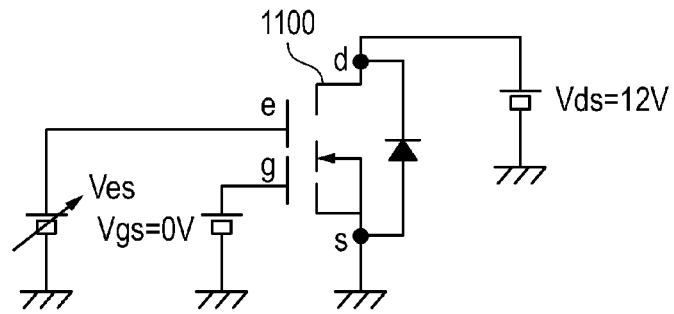
FIG. 11
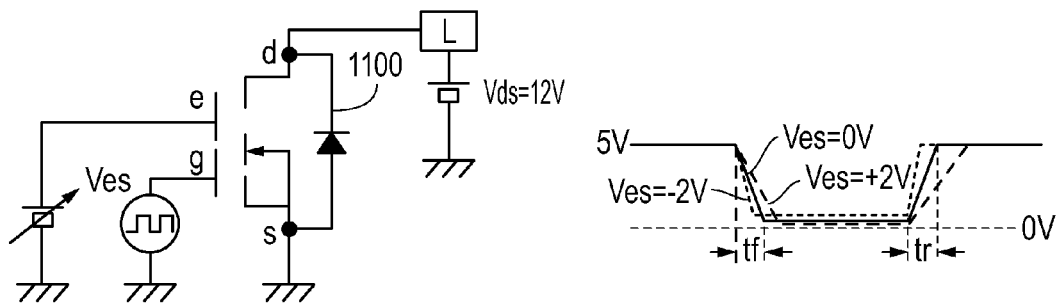
FIG. 12A
FIG. 12B
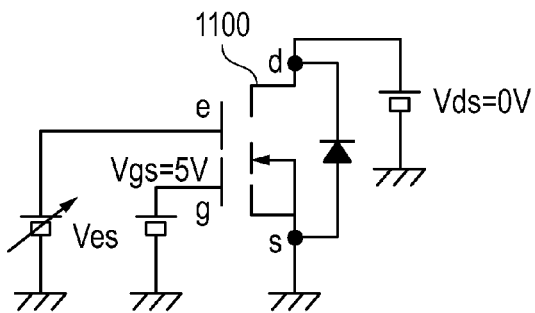
FIG. 13
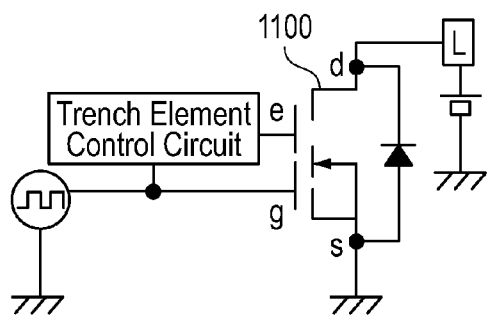
FIG. 14

TRENCH MOSFET HAVING AN INDEPENDENT COUPLED ELEMENT IN A TRENCH

CROSS-REFERENCE TO RELATED APPLICATIONS

The present patent application is a continuation of U.S. patent application Ser. No. 13/617,744, filed on Sep. 14, 2012, entitled "TRENCH MOSFET HAVING AN INDEPENDENT COUPLED ELEMENT IN A TRENCH" and is incorporated by reference herein in its entirety and for all purposes as if completely and fully set forth herein.

BACKGROUND OF THE INVENTION

DC-to-DC converters are electronic circuits that convert a direct current (DC) source voltage from one voltage level to another. DC-DC converters are important in electronic devices that contain one or more sub circuits that operate on voltages that are different from its source. For example, smart phones and tablet computers may contain sub circuits such as central processing units (CPUs), which operate on voltages that are different than the voltage provided by a source such as a rechargeable battery. An electronic device such as a smart phone may contain several DC-DC convertors that produce voltages at distinct levels for the needs of respective sub circuits. The present invention will be described primarily with reference to DC-DC converters employed in portable electronic devices powered by batteries, it being understood the present invention should not be limited thereto.

SUMMARY OF THE INVENTION

A trench MOSFET is disclosed that includes a semiconductor substrate having a vertically oriented trench containing a gate. The trench MOSFET further includes a source, a drain, and a conductive element. The conductive element, like the gate is contained in the trench, and extends between the gate and a bottom of the trench. The conductive element is electrically isolated from the source, the gate, and the drain. When employed in a device such as a DC-DC converter, an inverter, or a motor driver, the trench MOSFET may reduce power loss and/or noise.

BRIEF DESCRIPTION OF THE DRAWINGS

The present invention may be better understood in its numerous objects, features, and advantages made apparent to those skilled in the art by referencing the accompanying drawings.

FIG. 11 is a diagram of a circuit employing the MOSFET of FIG. 4.

FIG. 12A is a diagram of a circuit employing the MOSFET of FIG. 4.

FIG. 12B shows several wave forms of Vgs of the MOSFET in FIG. 12A with varying levels of Ves.

FIG. 13 is a diagram of a circuit employing the MOSFET of FIG. 4.

FIG. 14 is a diagram of a circuit employing the MOSFET of FIG. 4.

The use of the same reference symbols in different drawings indicates similar or identical items.

DETAILED DESCRIPTION

There are several considerations that should be taken into account in designing DC-DC converters. Noise generation is one consideration. Compactness of the DC-DC converter is another consideration. Power consumption may be the most important consideration.

Figure 1:
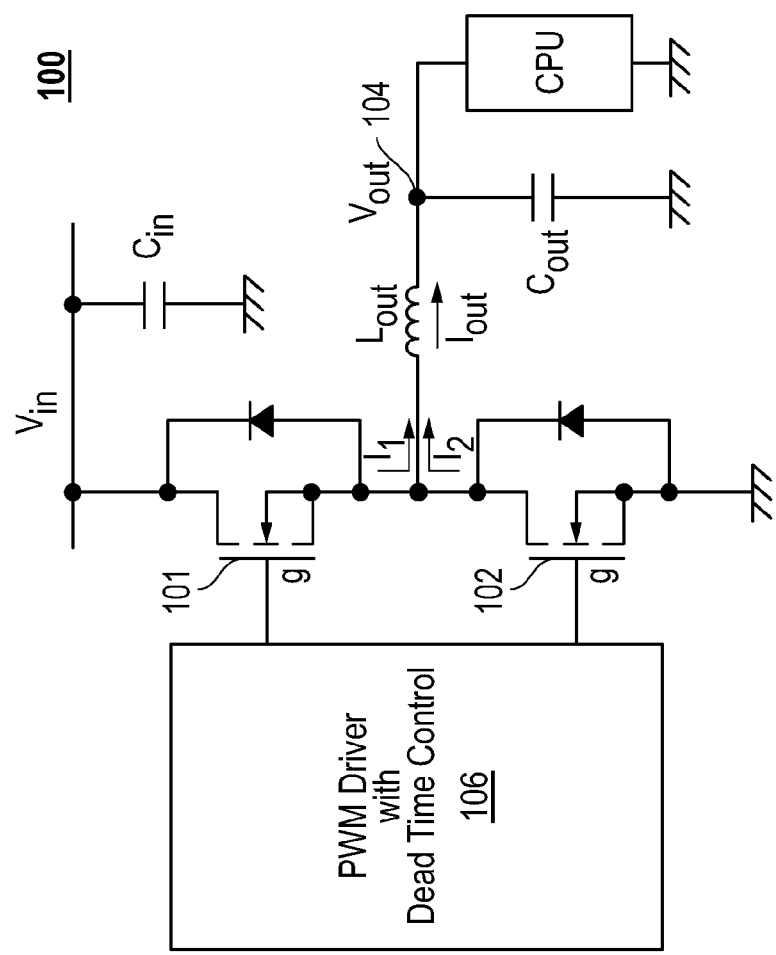
FIG. 1 is a block diagram illustrating an example DC-DC convertor.

FIG. 1 illustrates an example DC-DC converter 100 for converting a DC source voltage Vin to a DC output voltage Vout for powering a sub circuit load like a CPU. The source voltage Vin may be provided directly or indirectly by a battery such as a rechargeable lithium ion battery. DC-DC converter 100 can vary the magnitudes of output voltage Vout and current Iout to accommodate changing requirements of the load.

High-side transistor 101 and low-side transistor 102 are each coupled to an output inductor Lout, which in turn is coupled to the CPU via an output node 104 and an output capacitor Cout as shown. A pulse-width modulation (PWM) driver circuit with dead time control 106 (hereinafter PWM circuit 106) generates complimentary high-side and low-side square waves (not shown) that drive gates g of transistors 101 and 102, respectively. The pulses of the high-side and low-side square waves activate transistor 101 and transistor 102. When active, high-side transistor 101 and low-side transistor 102 transmit current. PWM circuit 106 may include a level shifter that adds a DC voltage component to the high-side square wave. The high-side square wave has a pulse width of t1, while the low-side square wave has a pulse width of t2, which can be different from t1. Both square waves have a frequency f that PWM circuit 106 can vary. PWM circuit 106 can also vary the duty cycles of the high and low-side square waves.

High-side transistor 101 transmits current I1 to output node 104 via inductor Lout with each pulse of the high-side square wave, while low-transistor 102 transmits current I2 from ground to output node 104 via inductor Lout with each pulse of the low-side square wave. Since the high-side and low-side square waves are complimentary, which means they do not overlap, only one of the transistors should be activated at any given time. Additionally, PWM circuit 106 introduces a dead time between pulses of the high-side and low-side square waves to prevent current shoot through, a condition in which both high-side transistor 101 and low-side transistor 102 are fully or partially active, thus creating a conductive path between Vin and ground through which current can "shoot through."

Noise Reduction

DC-DC converters should be quiet; they should not generate excessive electrical and electromagnetic noise that adversely affects neighboring sub circuits. DC-DC converter 100 should be compact in size and power efficient, especially when used in portable electronic devices. DC-DC converters consume power in several different ways. For example, power can be consumed when current is conducted between the source s and drain d of active transistor 101 or active transistor 102. The amount of this conductive power loss depends on the magnitude of Rds(on), the resistance that exists between the drain d and source s in transistor 101 or transistor 102 when activated. Another loss affecting power is attributable to the current that is needed to switch transistor 101 or transistor 102 between its active and inactive states. The amount of power loss, which is referred to as switching loss, may depend on many factors including the frequency f of the square waves and the magnitude of stray capacitances in transistors 101 or transistor 102.

Transistors 101 and 102 in FIG. 1 are shown as conventional or lateral metal oxide semiconductor field effect transistors (MOSFETs). DC-DC convertors often employ trench metal oxide field effect transistors (MOSFET) due to their compactness and low active drain-to-source resistance Rds(on). A lower Rds(on) can reduce the power consumed by DC-DC converters as will be more fully described below. The remaining disclosures will be primarlily described with reference to non-isolated, DC-DC converters employing one or more trench MOSFETs, it being understood that the present invention should not be limited thereto.

Figure 2:
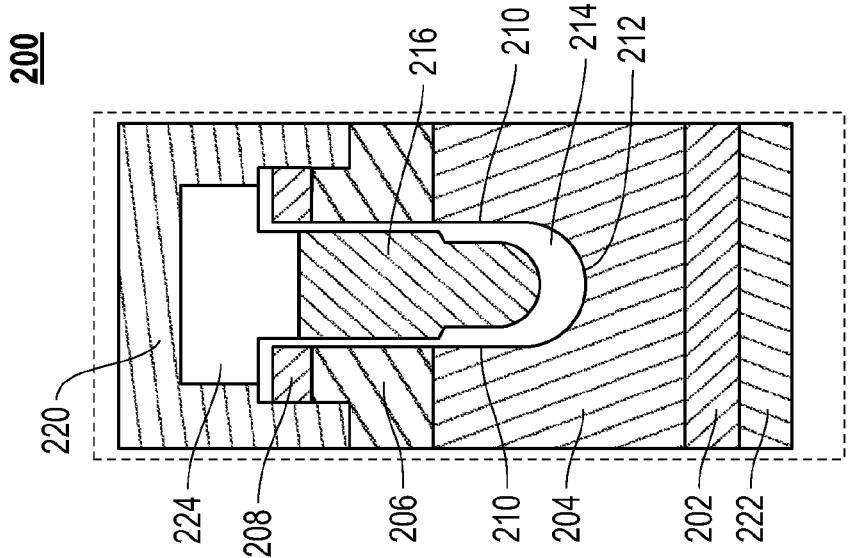
FIG. 2 is a cross sectional view of a trench MOSFET.

FIG. 2 illustrates a cross-sectional view of an example trench MOSFET 200 that could be employed in a DC-DC convertor like that shown in FIG. 1. Transistor 200 includes several layers within a substrate. More particularly, transistor 200 includes a highly doped drain layer 202 of a first conductivity type (e.g., N+), a drift layer 204 of the first conductivity type (e.g., N or N−), a relatively thin base layer 206 of second conductivity type (e.g., P), and a highly doped source layer 208 of the first conductivity type (e.g., N+). A trench is formed in the substrate, which has opposing side walls 210 and a bottom 212. It is noted the trench can be formed with a cylindrically shaped wall.

A gate insulating region 214 and an electrically conductive gate 216 is formed in the trench. Region 214 includes an insulating material such as silicon dioxide that can electrically insulate gate 216 from surrounding components such as the base layer 206 and drift layer 204. Gate 216 may be formed from a conductive material such as polysilicon. A source 220 and a drain 222 may also be formed of a conductive material. Source 220 is in ohmic contact with source layer 208 and base layer 206, while drain 222 is in ohmic contact with drain layer 202. Base layer 206 is in ohmic contact with source layer 208 and drift layer 204, which in turn is in ohmic contact with drain layer 202. An insulating region 224 isolates source 220 from gate 216. Insulating region 224, like insulating region 214, may be formed from an insulating material such as silicon dioxide.

In operation, MOSFET 200 can be activated when gate 216 reaches an appropriate voltage (i.e., a threshold voltage Vt). When activated, a conductive N-type inversion layer is formed in the P-type base layer 206. The inversion layer electrically connects the N-type source and drain regions 208 and 202, and allows for majority carrier conduction therebetween. Because the gate 216 is separated from the base layer 206 by an intervening insulating region 214, little if any gate current is required to maintain MOSFET 200 in the active or on state.

With continuing reference to FIG. 1, Cout and Lout can be reduced in size if transistor 101 and transistor 102 are switched at high frequencies. While smaller Cout and Lout leads to more compact DC-DC converters, the higher switching frequencies may lead to higher switching losses in transistors 101 and 102. Additionally, higher switching frequencies may lead to increased electrical or electromagnetic noise that can adversely affect the CPU and/or neighboring electrical components including those that are directly or indirectly coupled to Vin. When used as a high-side transistor or a low-side transistor, trench MOSFET 200 may have a lower Rds(on), which in turn may reduce its conduction losses. However, MOSFET 200 may contain relatively higher stray capacitances, which may exacerbate switching losses and noise generation.

Figure 3:
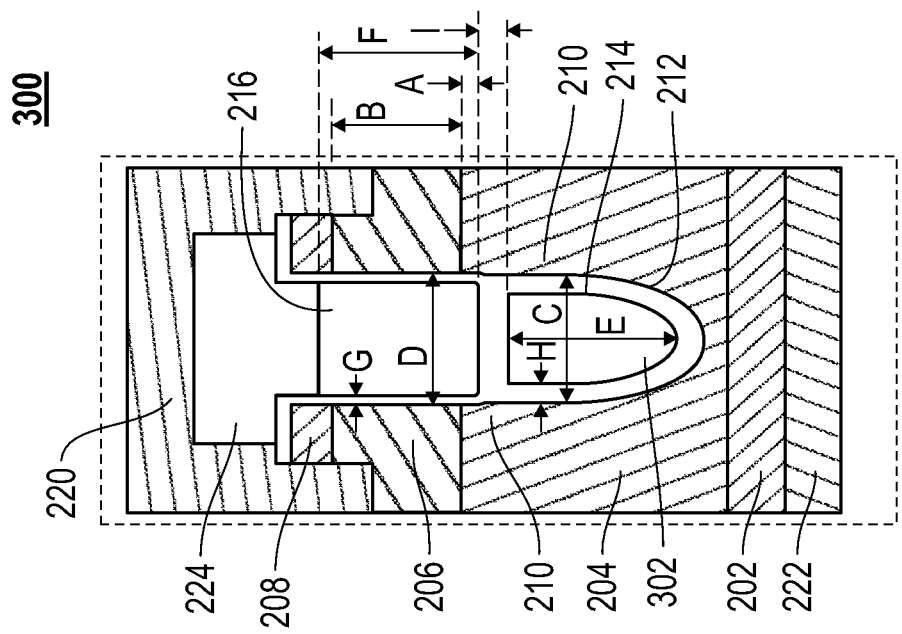
FIG. 3 is a cross sectional view of another trench MOSFET.

FIG. 3 illustrates an alternative trench MOSFET 300 that could be employed in DC-DC convertors like that shown in FIG. 1 or other devices. Trench MOSFET 300 is similar in many regards to other trench MOSFETS like trench MOSFET 200 shown in FIG. 2. For example, trench MOSFET 300 includes the same substrate layers 202-208 that are shown within FIG. 2. However, at least one significant difference exists between the trench MOSFET 200 and trench MOSFET 300; trench MOSFET 300 includes an additional trench element 302 that is positioned between gate 216 and trench bottom 212. Trench element 302 is isolated from gate 216, drain 222 and source 220. Trench element 302 can be formed of the same conductive material (e.g., polysilicon) that is used to form gate 216. Insulating region 214 electrically isolates trench element 302 from gate 216. In this configuration, trench element 302 shields gate 216 from drain 222.

With continuing reference to FIG. 3, the dimensions of MOSFET 300 may be selected to reduce resistive, capacitive effect and other characteristics, which may be important for reducing switching losses, conductive losses, etc. For example, the lateral thickness G of the insulating region (i.e., the gate oxide) between gate 216 and base layer 206 should be less than the lateral thickness H of the insulating region between the wall of the drift region and the wall of trench element 302 (i.e., the wall oxide of trench element 302), which may reduce Rds(on) and Coss (Coss=Cgd+Cds) of MOSFET 300. The length A from the channel bottom to the bottom of gate 216 should be less than B, the length from the bottom of source layer 208 to the bottom of the channel, which may reduce Crss, the reverse transfer capacitance of MOSFET 300. A reduction of Coss and Crss may reduce switching losses. The width C of opposing sidewalls of the element trench may be less than the width D of opposing sidewalls of the gate trench, which may reduce Rds(on) and the current density of in the drift region adjacent to element 302. The length E of element 302 should be equal to or longer than F, the length of gate 216, which may reduce noise generated by MOSFET 300 when subjected to a switching waveform. The thickness I of the insulating region between the gate 216 and element 302 should be greater than G, the thickness of the insulating region between gate 216 and base layer 206, which may reduce the gate charge Qg of MOSFET 300.

Figure 4:
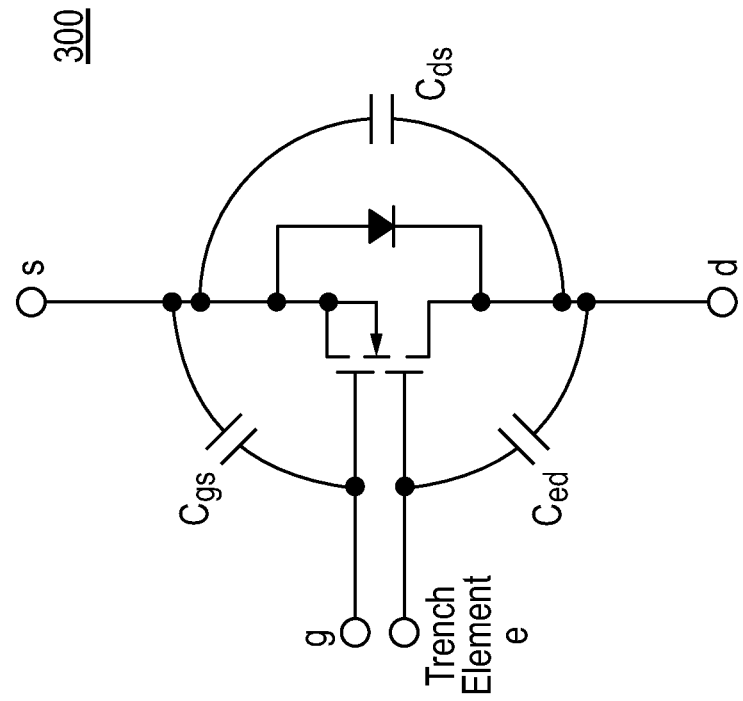
FIG. 4 is a circuit diagram illustrating relevant components of the trench MOSFET shown in FIG. 3.

FIG. 4 illustrates a circuit diagram equivalent of MOSFET 300 shown within FIG. 3, including representations of stray capacitors therein. While traditional trench MOSFETS have three terminals (gate terminal g, source terminal s, and drain terminal d), trench MOSFET has a fourth terminal e for the trench element 302. Cgs represents the capacitance that exists between the gate g and source s, Cds represents the capacitance at the PN junction of the drain d and source s, and Ced represents the capacitance that exists between trench element e and drain d. As noted above, the trench element e shields gate g from drain d. A capacitance Cgd (not shown) exists between the gate g and drain d; however, this capacitance is very small as a result of the shielding effect of trench element e.

Figure 5:
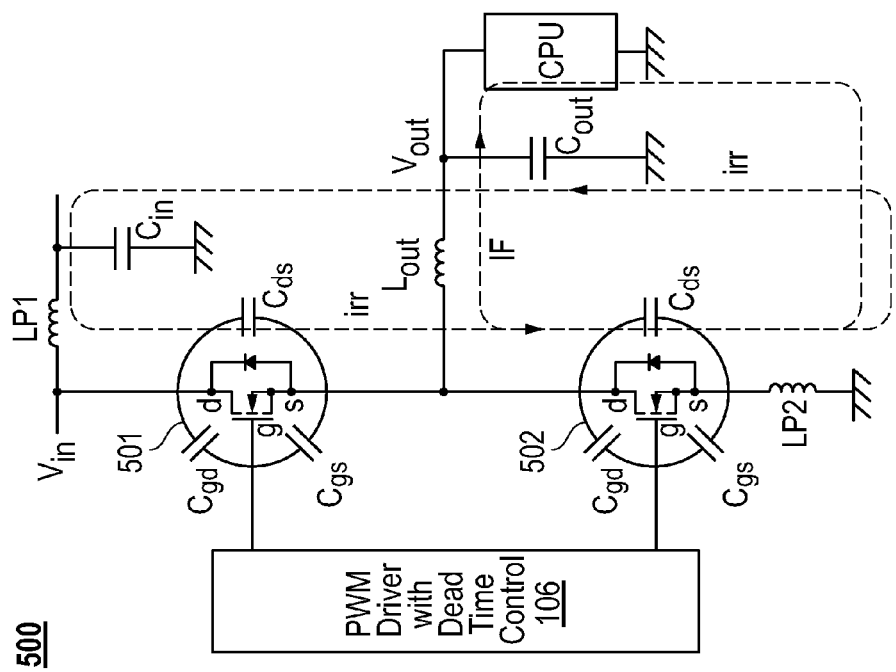
FIG. 5 is a block diagram illustrating relevant components of a DC-DC convertor that employs the trench MOSFET of FIG. 2.

FIG. 5 illustrates a DC-DC converter 500 similar to DC-DC convertor 100 in FIG. 1. DC-DC converter 500 includes a high-side transistor 501 and a low-side transistor 502, both of which take form in trench MOSFETs 200 shown in FIG. 2. Additionally, DC-DC circuit 500 shows inductor LP1, which may take form in stray inductance in a printed circuit board connection between capacitor Cin and high-side transistor 501, and inductor LP2, which may take form in stray inductance in the printed circuit board connection between low-side transistor 502 and ground.

Figure 6:
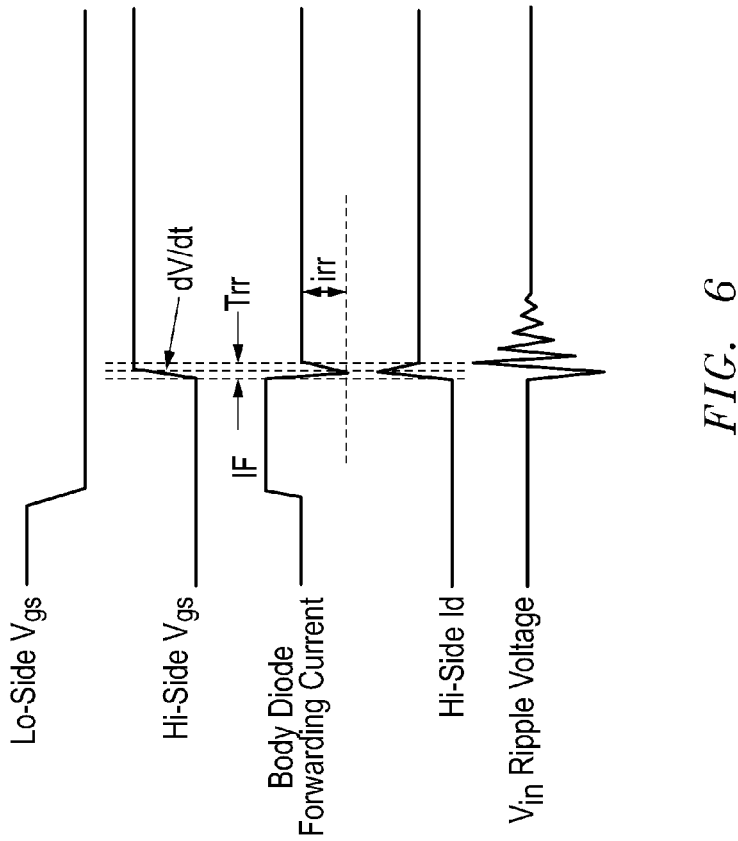
FIG. 6 is a timing diagram that shows relevant waveforms of the DC-DC convertor shown in FIG. 5.

PWM circuit 106 generates complimentary, high-side and low-side square waves (not shown) that drive the gates g of high-side and low-side transistors 501 and 502, respectively. Vgs, the voltage between the gate g and source s, of high-side and low-side transistors 501 and 502 rise and fall with the square waves. FIG. 6 illustrates several wave forms, including wave forms for Vgs at high-side and low-side transistors 501 and 502. PWM circuit 106 introduces a "dead time" between pulses of the high-side and low-side square waves. This dead time minimizes current shoot-through from Vin to ground, which can occur when both high-side transistor 501 and low-side transistor 502 are either fully or partially activated. The dead time can be seen in the wave forms for Vgs in FIG. 6. During the dead time output inductor Lout drives a forwarding current IF through body diode of low-side transistor 502. The path taken by IF goes through ground as shown in FIG. 5. FIG. 6 includes a waveform that represents the forwarding current IF through the body diode of low-side transistor 502. As high-side Vgs transitions, a reverse recovery current irr is induced in the body diode of transistor 502. The path of reverse recovery current irr goes through ground, LP1 and high-side transistor 501 as shown in FIG. 5. Irr flows in the opposite direction of IF. Irr spikes (i.e., irr is short in duration) with a peak value that approximates the magnitude of the drain current of the high-side transistor during the high-side pulse. Unfortunately, the spike creates a large ripple voltage with high frequency components on the Vin line via LP1. The high frequency components may create electrical and/or electromagnetic noise that can adversely affect nearby circuits including those circuits that are connected to Vin either directly or indirectly.

Figures 7, 8:
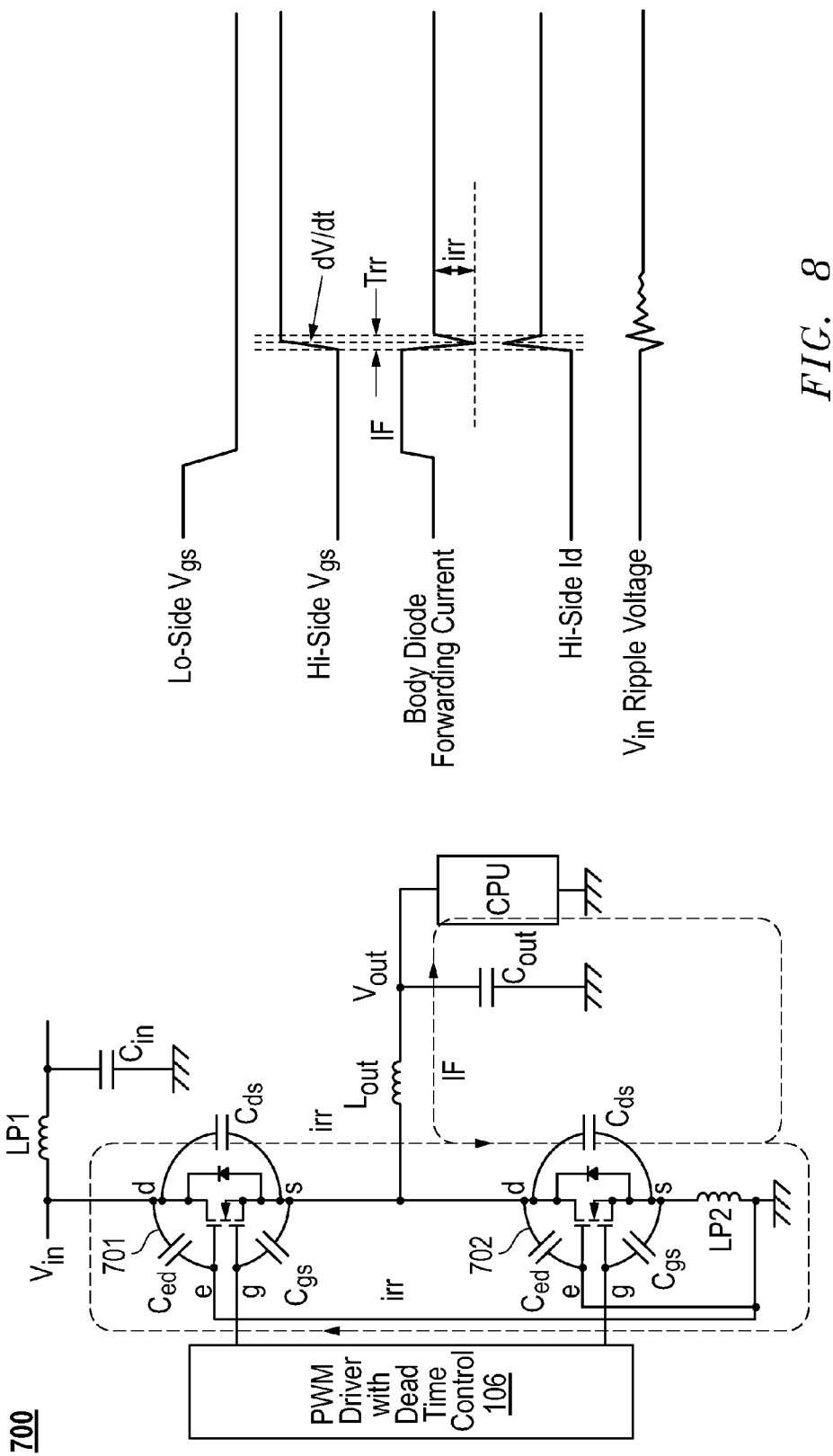
FIG. 7 is a block diagram illustrating relevant components of another DC-DC convertor that employs the trench MOSFET of FIG. 4.
FIG. 8 is a timing diagram that shows relevant waveforms of the DC-DC convertor shown in FIG. 7.

FIG. 7 illustrates an alternative DC-DC convertor 700 that is similar to DC-DC convertor 500. DC-DC convertor 700 includes a high-side transistor 701 and a low-side transistor 702, both of which take form in trench MOSFETs like that shown in FIGS. 3 and 4. High-side transistor 701 and low-side transistor 702 include trench elements e coupled together and to ground as shown.

With continuing reference to FIG. 7, FIG. 8 illustrates wave forms relevant to operational aspects of the DC-DC converter 700. PWM circuit 106 generates complimentary, high-side and low-side square waves (not shown), which in turn drive the gates g of high-side and low-side transistors 701 and 702, respectively. PWM circuit 106 introduces a dead time between pulses of the high-side and high-side square waves to prevent current shoot through. Output inductor Lout drives forwarding current IF, whose path is shown in FIG. 7, through body diode of transistor 702 during the dead time. As high-side Vgs transitions, a reverse recovery current irr is induced in the body diode of transistor 702 in the opposite direction of IF. Irr spikes as shown in FIG. 8. However, the reverse recovery current irr does not flow through LP1. Rather, some or most of reverse recovery current irr flows through Ced of high-side transistor 701, which offers little resistance to ground at high frequencies. As such, irr spike voltage disturbances on the Vin line are substantially reduced as shown in FIG. 8. This in turn will reduce adverse effects of electrical and/or electromagnetic noise generated by the DC-DC converter shown within FIG. 7.

Figure 9:
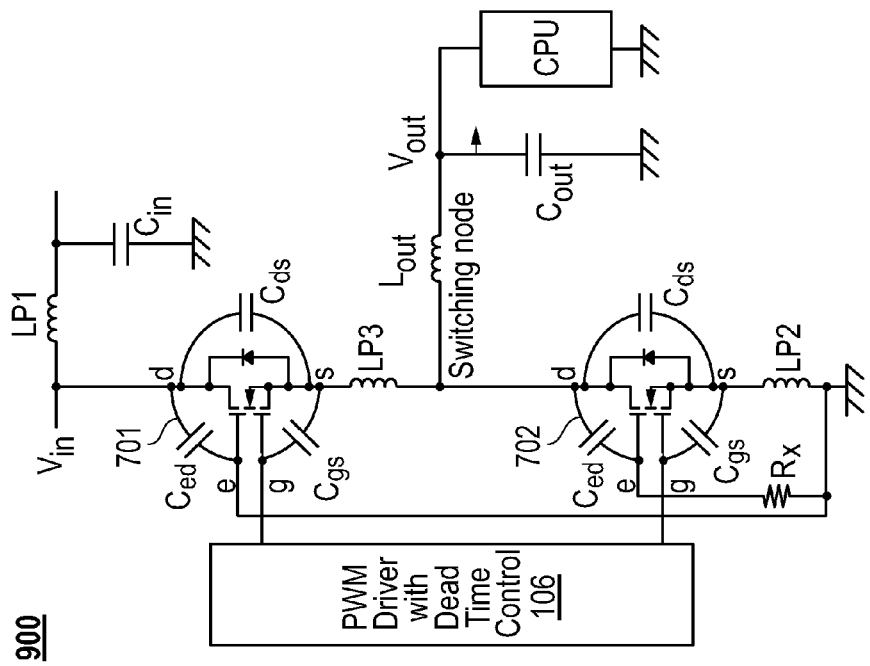
FIG. 9 is a block diagram illustrating a modified version of the DC-DC convertor shown in FIG. 7.

FIG. 9 shows another DC-DC convertor 900 that is substantially similar to the DC-DC converter 700 shown in FIG. 7. DC-DC converter 900 includes a resistor Rx coupled between ground and the trench electrode of low-side transistor 702. In one embodiment, Rx can be an external component, e.g., a component that is external to a substrate in which is formed high-side and low-side transistors 701 and 702, or an internal component, e.g., a component that is internal to a substrate in which is formed high-side and low-side transistors 701 and 702 (i.e., a interconnection resistance between trench element 302 of transistor 702 and surface conductive layer). FIG. 9 also shows inductor LP3, which may take form in stray inductance in the printed circuit board connection between the source of hi-side transistor 701 and the switching node. By connecting the trench element of low-side transistor 702 to ground via resistor Rx, a snubber circuit is formed. A snubber circuit is a device used to suppress voltage transients. During operation of the DC-DC convertor 700 of FIG. 7, a spike voltage may occur at the switching node when high-side transistor 701 activates due to the high rate of change of current flowing through inductors LP1, LP2, and/or LP3. The spike voltage at the switching node may produce adverse effects such as exceeding the breakdown voltage BVds of transistor 702. This voltage spike can be reduced by the snubber circuit that includes resistor Rx and the capacitance Ced that exists between the trench element and drain in low-side transistor 702.

Figure 10:
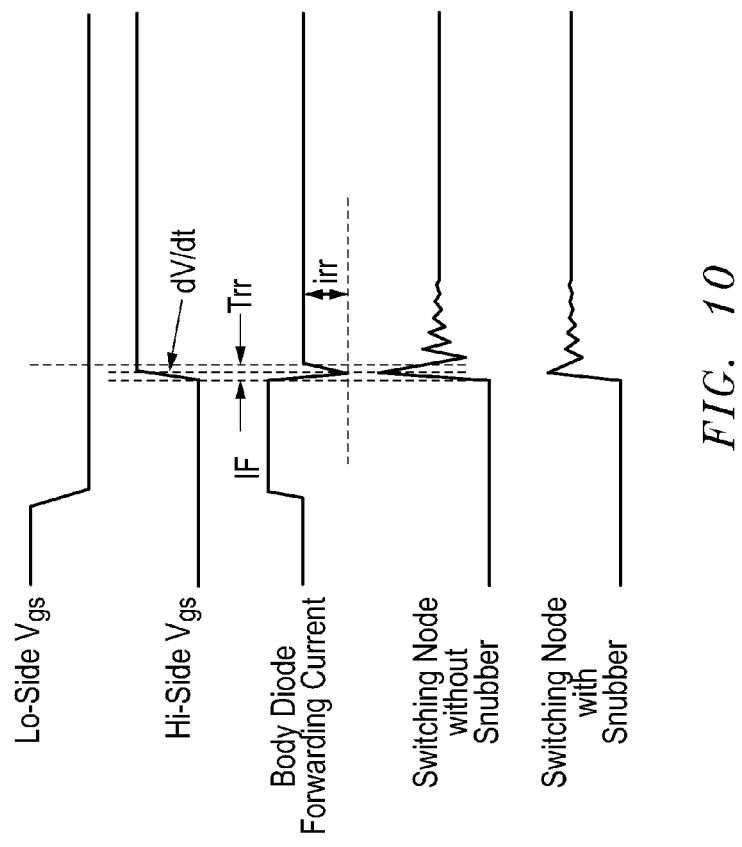
FIG. 10 is a timing diagram that shows relevant waveforms of the DC-DC convertors shown in FIG. 9.

FIG. 10 illustrates the wave form at the switching node for the DC-DC converter 700 without the snubber circuit and the DC-DC converter 900 with the snubber circuit. As can be seen, the snubber circuit acts to reduce the transient voltages at the switching node, which in turn reduces the chances that the breakdown voltage BVds is exceeded.

Power Loss Reduction

Voltage spikes and transients are some of the issues that should be considered when designing DC-DC converters. As noted above, power loss is another issue, especially in DC-DC converters employed in battery powered devices. In general, a transistor consumes power when it conducts current between its source and drain, or when the transistor switches between the active and inactive states. To illustrate, power is lost by low-side transistor 702 of FIG. 7 when active and conducting current. This conduction loss is dependent on Rds(on), the resistance between the source and drain. Power is also lost by low-side transistor 702 when it switches between the active and inactive states in response to changes in Vgs. This switching loss is dependent on at least three factors: (1) tr, the time it takes Vgs to rise to the voltage of the pulse generated by PWM circuit 106 (see, e.g., FIG. 7); (2) tf, the time it takes for Vgs to fall after the gate is driven to ground by PWM circuit 106, and; (3) Coss=Cgd+Cds. It is noted that Cgd is small in low-side transistor 702 as a result of shielding by the trench element e. Because Cgd is small, Coss is approximately equal to Cds in low-side transistor 702. If Rds(on) can be lowered, conduction loss in low-side transistor 702 can be reduced accordingly. Further, if tr, tf and/or Coss can be lowered, switching loss in low-side transistor 702 can be reduced accordingly.

FIGS. 11, 12A, 13, and 14 illustrate circuits employing a trench MOSFET 1100 like that shown within FIG. 4. For ease of illustration, the stray capacitances Cgs, Cds, and Ced are not shown in FIGS. 11, 12A, 13, and 14. In FIG. 11, the gate g of trench MOSFET 1100 is set to 0 volts, which biases MOSFET 1100 in the inactive or off state. As Ves decreases from a higher voltage to a lower voltage, Coss decreases. For example, when Ves decreases from +2 volts to −2 volts, Coss can decrease by 20%. This change in Coss may be attributable to a modulation of the depletion layer thickness within the drift region of trench MOSFET 1100. It is also noted that Cgd, although negligible, can decrease by 34% as Ves decreases from +2 volts to −2 volts.

If the high-side and low-side transistors of a DC-DC converter are implemented as trench MOSFETs like that shown in FIGS. 3 and 4 (e.g., trench MOSFETs with trench elements 302), the shielding effect of the trench elements may reduce switching losses when compared to the switching losses of high-side and low-side transistors implemented as trench MOSFETs like that shown in FIG. 2. At the very least a decrease in Coss should result in a corresponding reduction in switching losses.

FIG. 12A illustrates MOSFET 1100 with its gate g tied to a source that generates a square wave like the low-side square wave generated by PWM circuit 106 in FIGS. 7 and 9. The square wave varies between 0 volts and 5 volts. Additionally, the drain of MOSFET 1100 is coupled to a load L in series with a voltage source as shown. In this configuration, trench MOSFET 1100 switches between the active and inactive states as the square wave changes between 0 and 5 volts. Vgs doesn't instantly change with the transitions of the square wave. To illustrate, FIG. 12B shows several wave forms: Vgs with Ves set to 2 volts; Vgs with Ves set to 0 volts, and; Vgs with Ves to −2 volts. Tf and tr, the fall and rise times, respectively of Vgs, decreases when Ves is set to a lower voltage. FIG. 12B shows tf and tr for Vgs with Ves set to 0 volts. A decrease in tr and tf should result in corresponding reductions in switching losses.

FIG. 13 illustrates trench MOSFET 1100 with Vgs set to 5 volts, which biases MOSFET 1100 to the active or on state. As Ves increases from a lower voltage to a higher voltage, Rds (on) decreases. For example, as Ves increases from −2 volts to +2 volts, Rds(on) may decrease by 6%. The decrease in Rds (on) may be attributable to an accumulation of electron charge in the drift zone, which in turn may reduce drift zone resistance.

FIG. 14 illustrates the trench MOSFET 1100 shown in FIG. 13 with a trench element control circuit coupled to trench element e. Trench element control circuit can dynamically control the voltage applied to trench element e in order to reduce power losses in trench MOSFET 1100. In one embodiment, trench element control circuit applies one of a plurality of voltages to trench element e depending on the state of trench MOSFET 1100. For example, trench element control circuit may apply a first voltage to trench element e while trench MOSFET 1100 is switching between the active and inactive states in order to reduce switching losses, and trench element control circuit may apply a second, higher voltage to trench element e when trench MOSFET 1100 is active in order to reduce conduction losses.

In one embodiment, trench element control circuit can apply one of a plurality of voltages to trench element e based on the magnitude of Vgs. For example, trench element control circuit may apply a first voltage (e.g., −4.3 volts) to trench element e when Vgs is less than a threshold voltage Vc (e.g., 4 volts), and trench element control circuit may apply a second voltage (e.g., 5 volts) to trench element e when Vgs is greater than the threshold voltage Vc. The threshold voltage Vc can be preselected based on the voltage of the pulse generated by the square wave generator. In one embodiment, the threshold voltage may be set to 75-95% of the pulse voltage magnitude, it being understood the present invention should not be limited thereto.

Figure 15A:
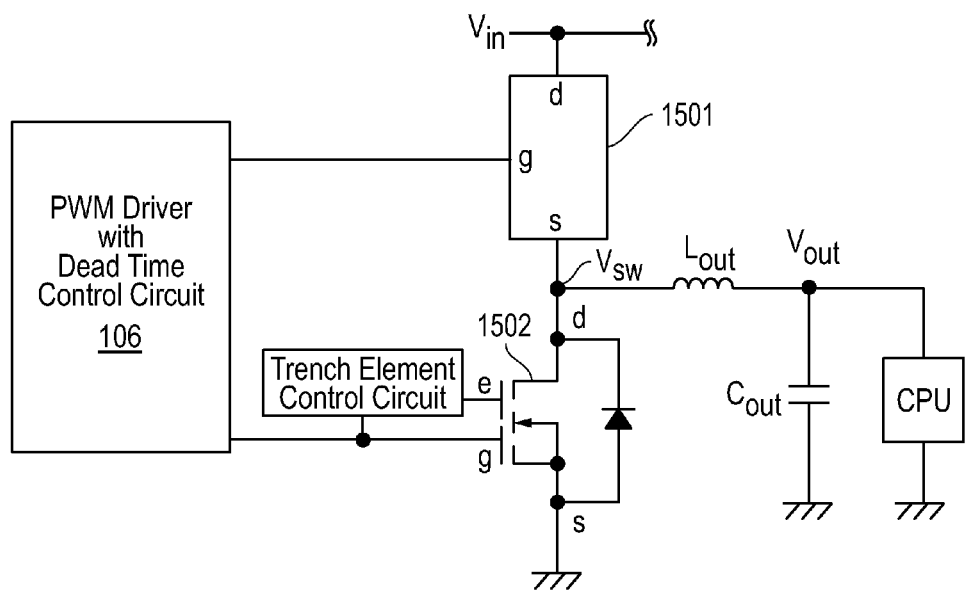
FIG. 15A is circuit diagram of a DC-DC converter.
Figure 16A:
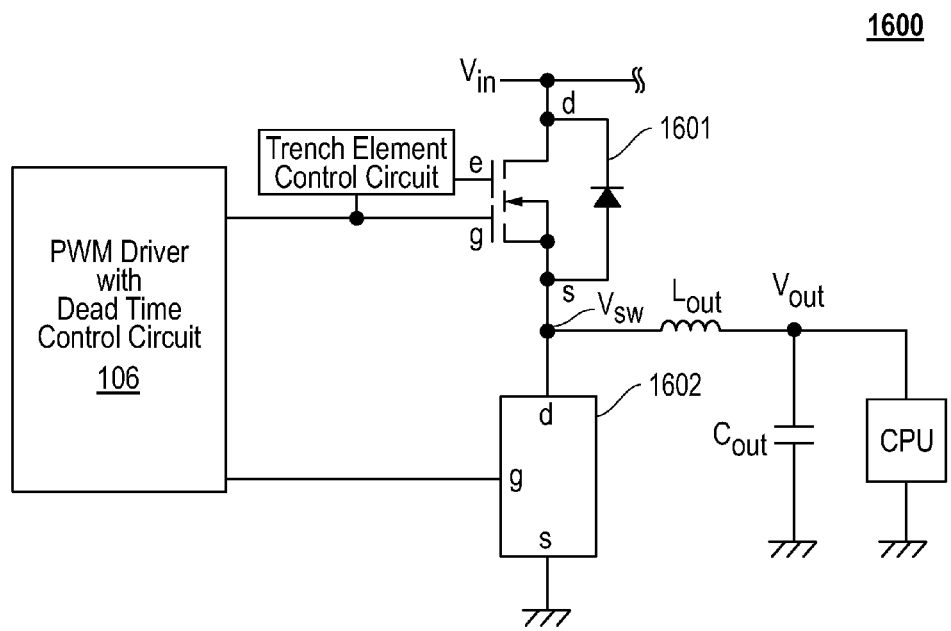
FIG. 16A is circuit diagram of a DC-DC converter.
Figure 17A:
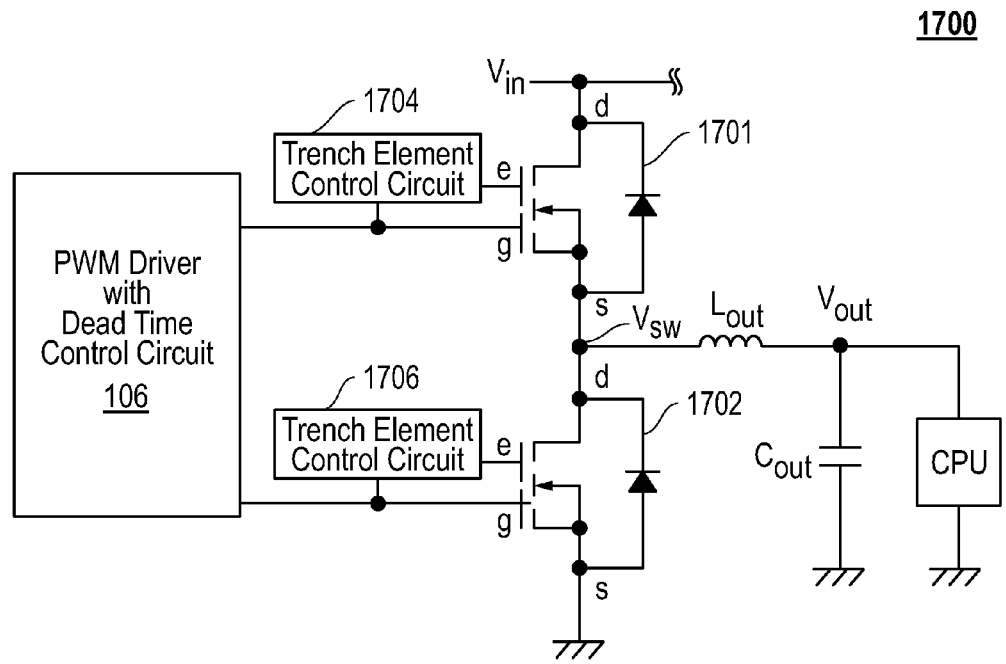
FIG. 17A is circuit diagram of a DC-DC converter.

FIGS. 15A, 16A, and 17A illustrate three different embodiments of a DC-DC converter employing at least one trench MOSFET like that shown in FIGS. 3 and 4, and at least one trench element control circuit like that shown within FIG. 14. For ease of illustration, the stray capacitances Cgs, Cds, and Ced are not shown in FIGS. 15A, 16A, and 17A.

Figure 15B:
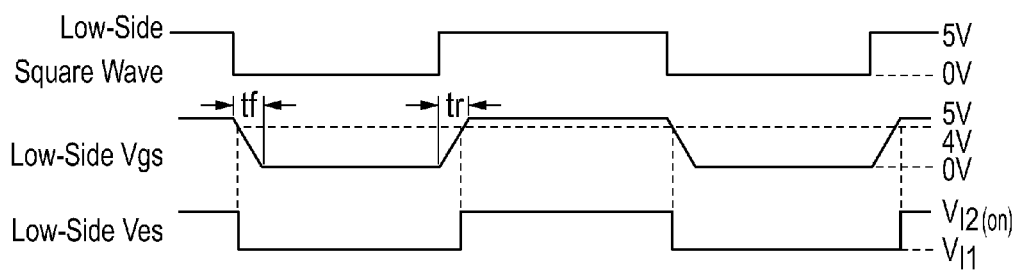
FIG. 15B is a timing diagram illustrating relevant waveforms of the DC-DC converter of FIG. 15A.

In FIG. 15A, the high-side transistor 1501 is generically illustrated and may take form in a lateral MOSFET like that shown in FIG. 1, a trench MOSFET like that shown in FIG. 2, or a trench MOSFET like that shown within FIGS. 3 and 4. Low-side transistor 1502 takes form in a trench MOSFET like that shown in FIGS. 3 and 4. The trench element control circuit controls Ves based on Vgs. The trench element control circuit applies a first voltage V11 (e.g., −4.3 volts) to element e when Vgs is less than a threshold voltage Vlt (e.g., 4 volts), and trench element control circuit applies a second, higher voltage V12 (e.g., 5 volts) to element e when Vgs exceeds the threshold voltage Vlt. FIG. 15B show three waveforms; one for the low-side square wave generated by PWM circuit 106, a waveform for Vgs, and a waveform for Ves. PWM circuit 106 drives gate g of the low-side transistor 1502 via the low-side square wave.

The trench element control circuit monitors Vgs as it follows the low-side square wave. The trench element control circuit applies first voltage V11 to element e soon after Vgs begins its transition from 5 volts to zero volts, and the trench element control circuit applies the second, larger voltage V12 to the element e just before Vgs rises to 5 volts. One of ordinary skill understands that when Vgs is greater than the threshold voltage Vlt (e.g., 4 volts) while Ves is set to the second voltage V12, low-side transistor 1502 is active and loses less power through conduction when compared to the conduction loss when low-side transistor 1502 is active while Ves is set to the first, lower voltage V11. Further, when Vgs is less than the threshold voltage Vlt while Ves is set to the first voltage V11, low-side transistor 1502 is inactive or in transition between the active and inactive states. While in transition between the active and inactive states, low-side transistor 1502 should lose less power through switching when compared to the switching loss experienced while Ves is set to the second voltage V12.

Figure 16B:
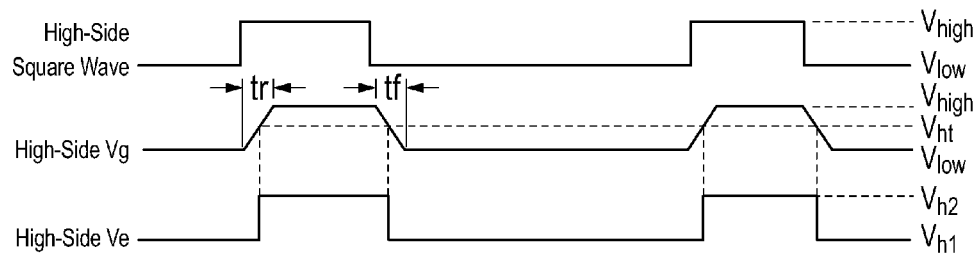
FIG. 16B is a timing diagram illustrating relevant waveforms of the DC-DC converter of FIG. 16A.

In FIG. 16A, high-side transistor 1601 takes form in a trench MOSFET like that shown within FIGS. 3 and 4. The trench element control circuit of FIG. 16A is similar to the trench element control circuit of FIG. 15B. The low-side transistor 1602 in FIG. 16A is generically shown and may take form in a lateral MOSFET like that shown within FIG. 1, a trench MOSFET like that shown in FIG. 2, or the trench MOSFET like that shown in FIGS. 3 and 4. In this embodiment, the trench element control circuit controls the voltage applied to element e of the high-side transistor 1601 based on the voltage at the gate g. For example, the trench element control circuit applies a first voltage Vh1 to element e when the gate voltage is less than a threshold voltage Vht, and trench element control circuit applies a second, higher voltage Vh2 to element e when the gate voltage is greater than the threshold voltage Vth. FIG. 16B shows separate waveforms for high-side square wave generated by PWM circuit 106, Vgs, and Ves. PWM circuit 106 drives gate g of the high-side transistor 1601 via the high-side square wave.

The trench element control circuit monitors the voltage at the gate g as it changes with the change in the high-side square wave. The trench element control circuit applies the first voltage Vh1 soon after the gate voltage begins its transition from the high voltage to the low voltage, and the trench element control circuit applies the second, larger voltage Vh2 just before gate voltage rises to the high voltage. When the gate voltage is greater than the threshold voltage Vht while element e is set to the second voltage Vh2, high-side transistor 1601 should be active and should lose less power through conduction when compared to the conduction loss when high-side transistor 1601 is active while the voltage at element e is set to the first voltage Vh1. When the voltage at the gate is less than the threshold voltage Vht while the voltage at element e is set to the first voltage Vh1, high-side transistor 1601 should be inactive or in transition between the active and inactive states. While in transition between the active and inactive states, high-side transistor 1601 should lose less power through switching when compared to the switching loss while element e is set to the second voltage Vh2.

The DC-DC converter 1700 shown within FIG. 17A includes high-side and low-side transistors 1701 and 1702 that take form in trench MOSFETs like that shown within FIGS. 3 and 4. DC-DC converter 1700 also includes high-side and low-side trench element control circuits that are similar to the trench element control circuits in FIGS. 16B and 15B, respectively.

Figure 17B:
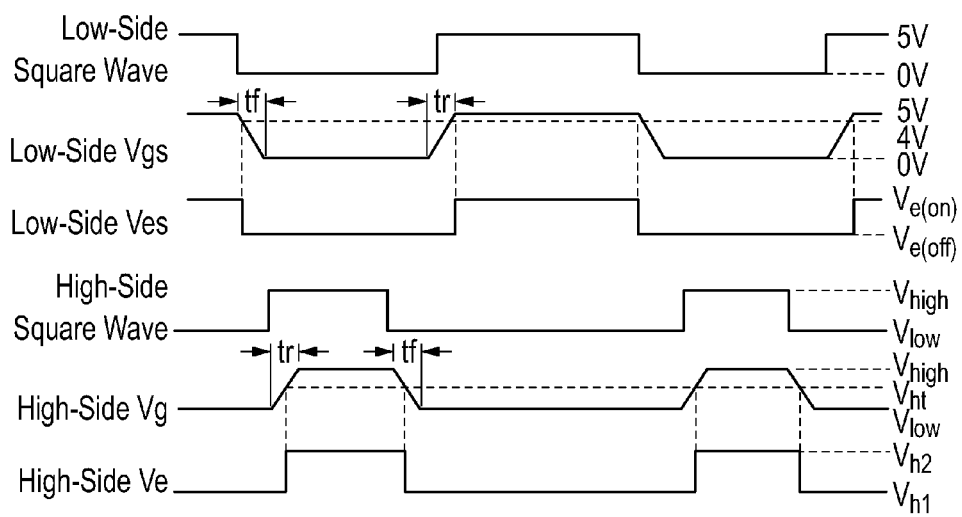
FIG. 17B is a timing diagram illustrating relevant waveforms of the DC-DC converter of FIG. 17A.

Trench element control circuit 1704 applies a first voltage Vh1 to element e when the voltage at gate g is less than threshold voltage Vht, and trench element control circuit 1704 applies a second, higher voltage Vh2 to element e when the gate voltage is greater than threshold voltage Vht. FIG. 17B shows waveforms for the square waves generated by PWM circuit 106, Vgs, and Ves for low-side and high-side transistors. PWM circuit 106 drives gate g of the high-side transistor 1701 via the high-side square wave.

Trench element control circuit 1704 monitors the voltage at gate g as it follows the high-side square wave. Trench element control circuit 1704 applies the first voltage Vh1 to element e soon after the voltage at gate g begins its transition from the high voltage to the low voltage, and trench element control circuit 1704 applies the second, larger voltage Vh2 to element e just before the gate voltage rises to the high voltage.

Low-side trench element control circuit 1706 applies a first voltage Vl1 (e.g., −4.3 volts) to element e when Vgs of low-side transistor 1702 is less than a threshold voltage Vlt (e.g., 4 volts), and trench element control circuit 1706 applies a second, higher voltage Vl2 (e.g., 5 volts) to element e when Vgs exceeds the threshold voltage Vlt. With continuing reference to FIG. 17B, trench element control circuit 1706 controls the voltage at trench element e based on Vgs. PWM circuit 106 drives gate g of the low-side transistor 1702 via the low-side square wave. Trench element control circuit 1706 monitors Vgs as it follows the low-side square wave.

Trench element control circuit 1706 applies the first voltage v11 to element e soon after Vgs begins its transition from 5 volts to zero volts, and trench element control circuit 1706 applies the second, larger voltage V12 to element e just before Vgs rises to 5 volts. The first voltage Vh1 applied by trench element control circuit 1704 may be greater than the first voltage Vl1 applied by trench element control circuit 1706. Likewise, the second voltage Vh2 applied by trench element control circuit 1704 may be greater than the second voltage V12 applied by trench element control circuit 1706.

Figure 15C:
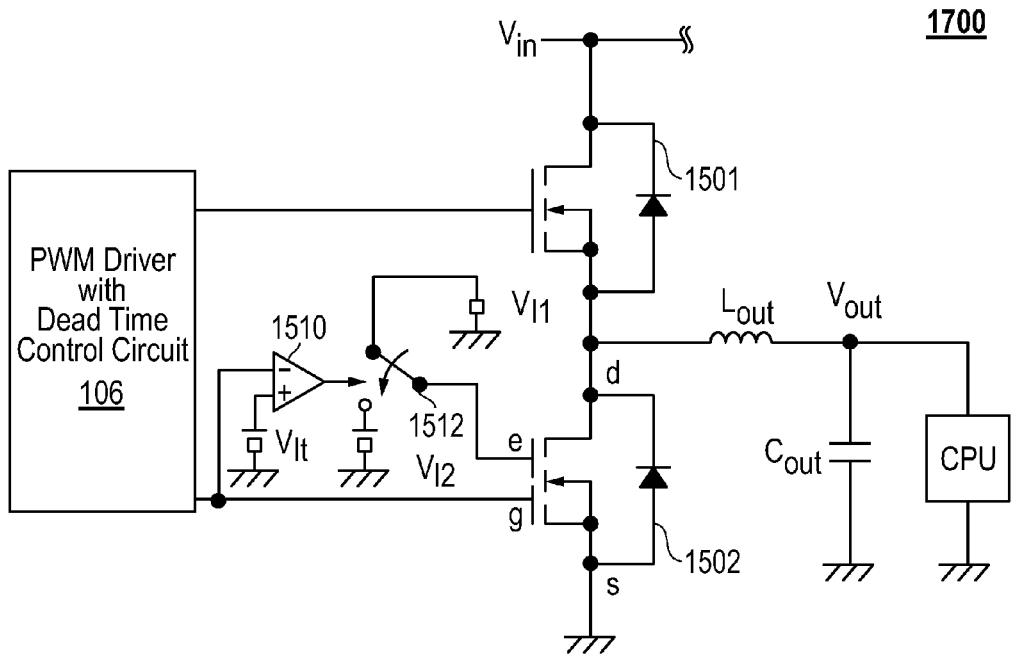
FIG. 15C is circuit diagram of one embodiment of the DC-DC converter shown in shown in FIG. 15A.
Figure 15D:
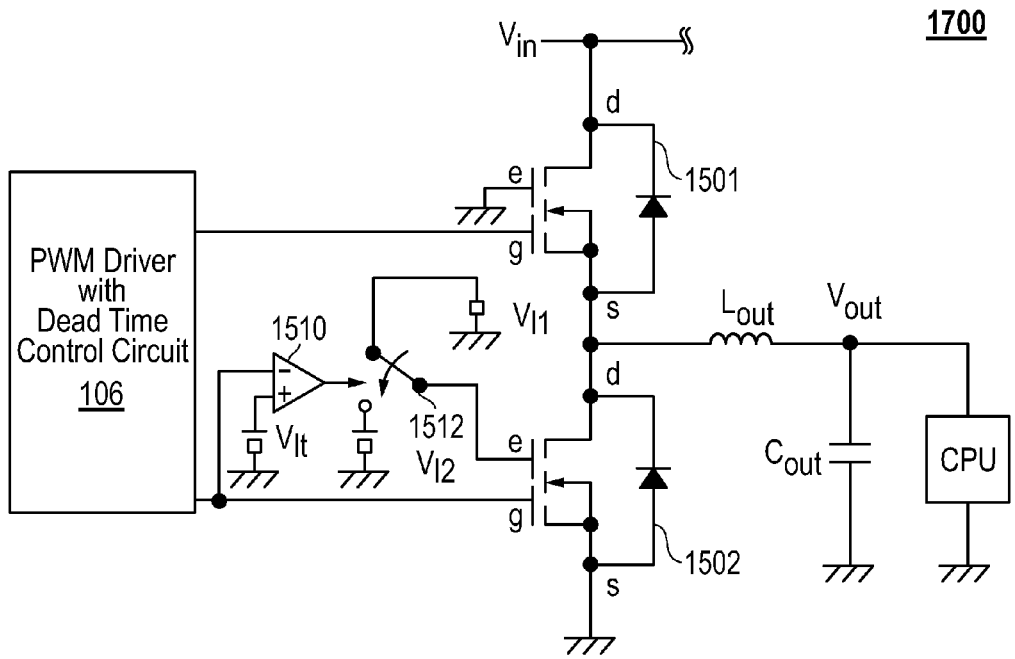
FIG. 15D is circuit diagram of one embodiment of the DC-DC converter shown in shown in FIG. 15A.

FIGS. 15C and 15D illustrate alternative embodiments of the DC-DC converter shown within FIG. 15A. In FIG. 15C, high-side transistor 1501 takes form in a trench MOSFET like that shown within FIG. 2. The trench element control circuit includes a comparator 1510 that compares low-side Vgs with Vlt=4 volts, which is provided by a constant source. When low-side Vgs rises above 4 volts, comparator 1510 causes switch 1512 to couple trench element e to a source that provides Vl2=5.0 volts. In other words, as low-side transistor 1502 activates, the trench element control circuit couples element e to 5 volts, which in turn reduces the conduction loss of low-side transistor 1502 while it is active. However, as low-side Vgs begins to fall below Vlt=4 volts, comparator 1510 causes switch 1512 to couple element e to a source that provides Vl1=−4.3 volts. In other words, as the low-side transistor 1502 begins to transition between the active and inactive states, trench element e is coupled to −4.3 volts, which reduces switching loss within low-side transistor 1502.

DC-DC converter 1500 shown within FIG. 15D includes the same trench element control circuit and low-side transistor found within FIG. 15C. However, the high-side transistor 1501 takes form in a trench MOSFET like that shown within FIGS. 3 and 4. In this configuration, trench element e of the high-side transistor 1501 is coupled to ground. In this configuration, any voltage spikes caused by irr (described above with reference to FIG. 8) should be reduced or eliminated.

Figure 16C:
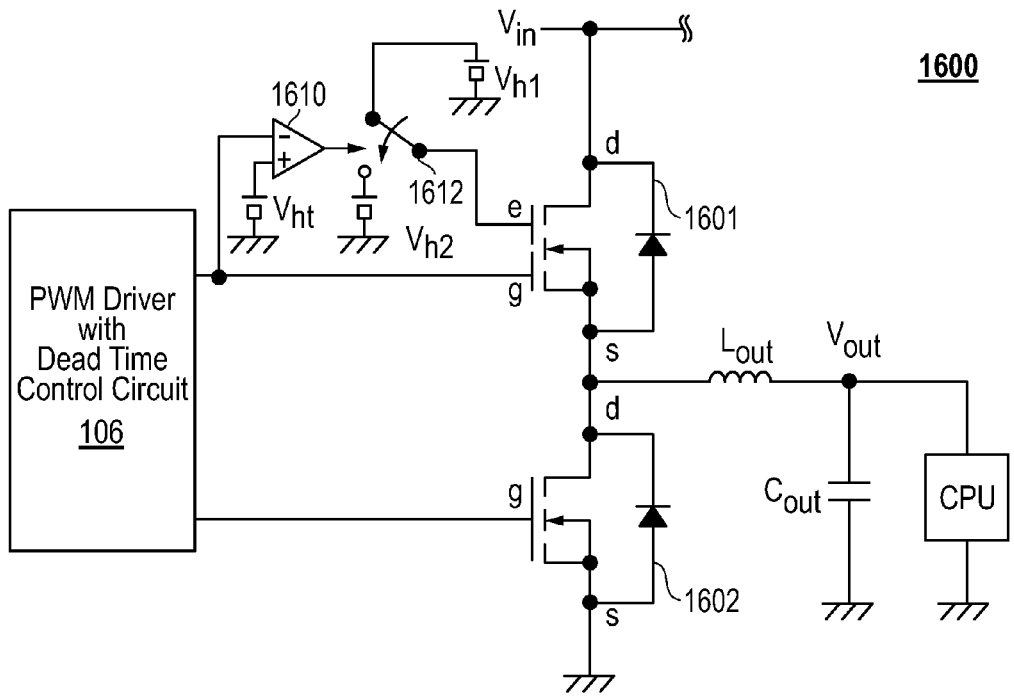
FIG. 16C is circuit diagram of one embodiment of the DC-DC converter shown in shown in FIG. 16A.
Figure 16D:
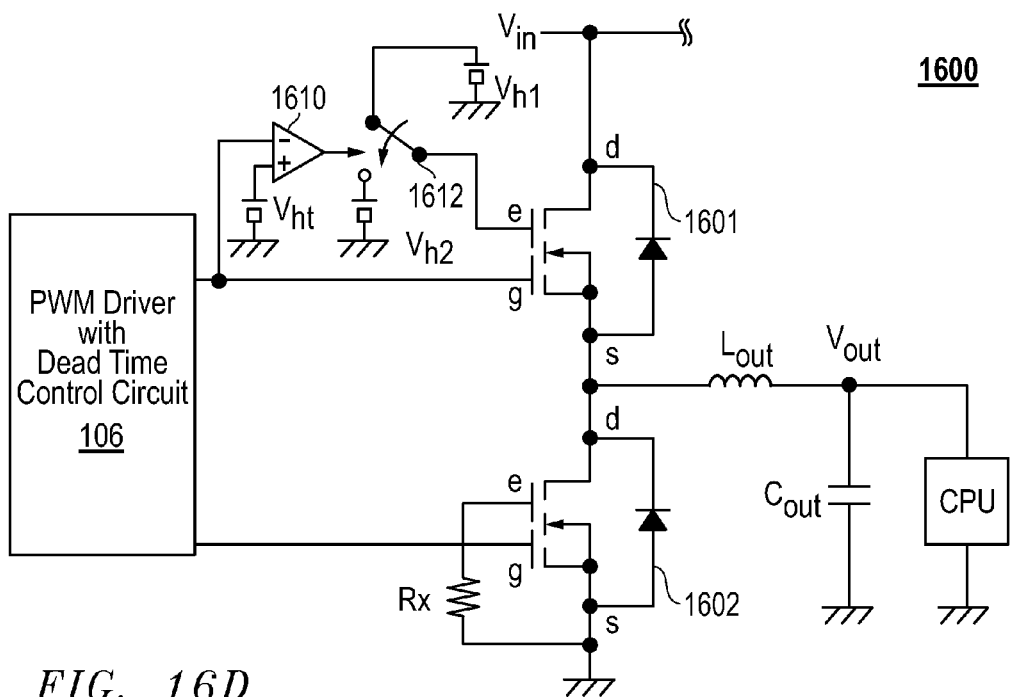
FIG. 16D is circuit diagram of one embodiment of the DC-DC converter shown in shown in FIG. 16A.

FIGS. 16C and 16D illustrate alternative embodiments of the DC-DC converter 1600 shown within FIG. 16A. In FIG. 16C, low-side transistor 1602 takes form in a trench MOSFET like that shown within FIG. 2. The trench element control circuit includes a comparator 1610 that compares the voltage at gate g with Vht provided by a constant source. When high-side Vgs rises above Vht, comparator 1610 causes switch 1612 to couple trench element e to a source that provides Vh2. In other words, as high-side transistor 1602 activates, the trench element control circuit couples element e to Vh2 volts, which in turn should reduce the conduction loss of high-side transistor 1602 while it is active. However, as the voltage at gate g begins to fall below Vht, comparator 1610 causes switch 1612 to couple element e to a source that provides Vh1. In other words, as the high-side transistor 1602 begins to transition between the active and inactive states, trench element e is coupled to Vh1, which should reduce switching loss within high-side transistor 1602.

DC-DC converter 1600 shown within FIG. 16D includes the same trench element control circuit and high-side transistor found within FIG. 16C. However, the low-side transistor 1602 takes form in a trench MOSFET like that shown within FIGS. 3 and 4. In this configuration, a snubber resistor Rx is coupled between trench element e and ground. In this configuration, any voltage spikes at the switching node should be reduced as described above with reference to FIG. 10.

Figure 17C:
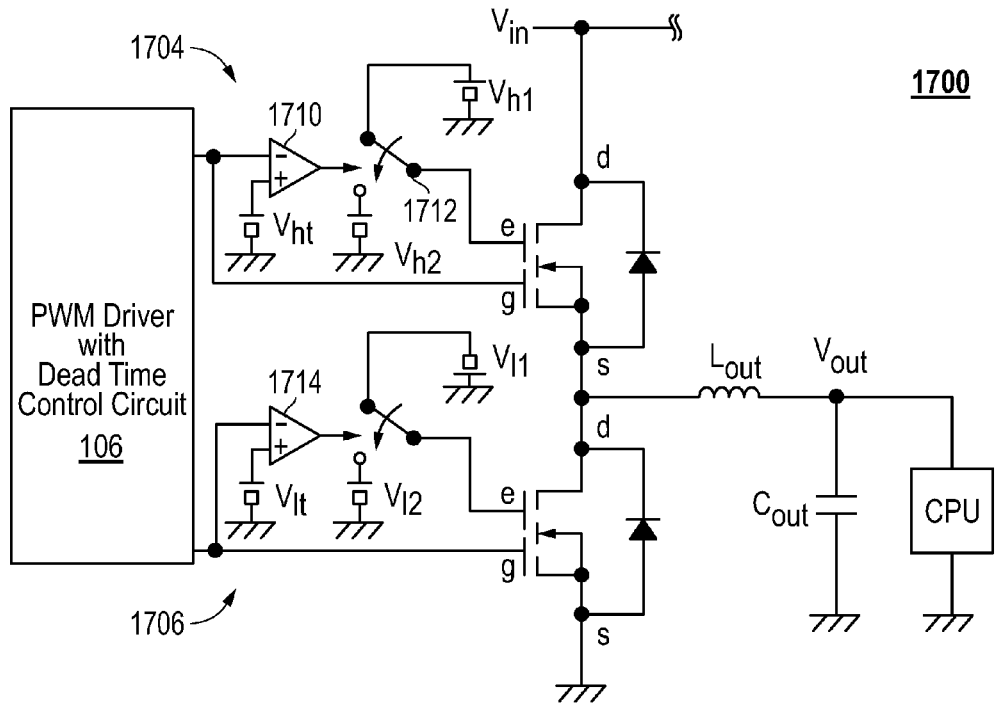
FIG. 17C is circuit diagram of one embodiment of the DC-DC converter shown in shown in FIG. 17A.

FIG. 17C illustrates an embodiment of the DC-DC converter 1700 shown within FIG. 17A. The trench element control circuit 1704 includes a comparator 1710 that compares the voltage at gate g with Vht provided by a constant source. When the voltage at the gate g rises above Vht, comparator 1710 causes switch 1712 to couple trench element e to a source that provides Vh2. In other words, as high-side transistor 1702 activates, the trench element control circuit 1704 couples element e to Vh2, which in turn reduces the conduction losses of high-side transistor 1702 while it is active. However, as the voltage at gate g begins to fall below Vht, comparator 1710 causes switch 1712 to couple element e to a source that provides Vh1. In other words, as the high-side transistor 1702 begins to transition between the active and inactive states, trench element e is coupled to Vh1, which reduces switching losses within high-side transistor 1702.

The low-side trench element control 1706 circuit includes a comparator 1714 that compares low-side Vgs with Vlt=4 volts provided by a constant source. When low-side Vgs rises above 4 volts, comparator 1714 causes switch 1714 to couple trench element e to a source that provides Vl2=5.0 volts. In other words, as low-side transistor 1702 activates, the trench element control circuit 1706 couples element e to 5 volts, which in turn reduces conduction losses of low-side transistor 1702 while it is active. However, as low-side Vgs begins to fall below 4 volts, comparator 1714 causes switch 1716 to couple element e to a source that provides Vl1=−4.3 volts. In other words, as the low-side transistor 1702 begins to transition between the active and inactive states, trench element e is coupled to −4.3 volts, which reduces switching losses within low-side transistor 1702.

Figure 18:
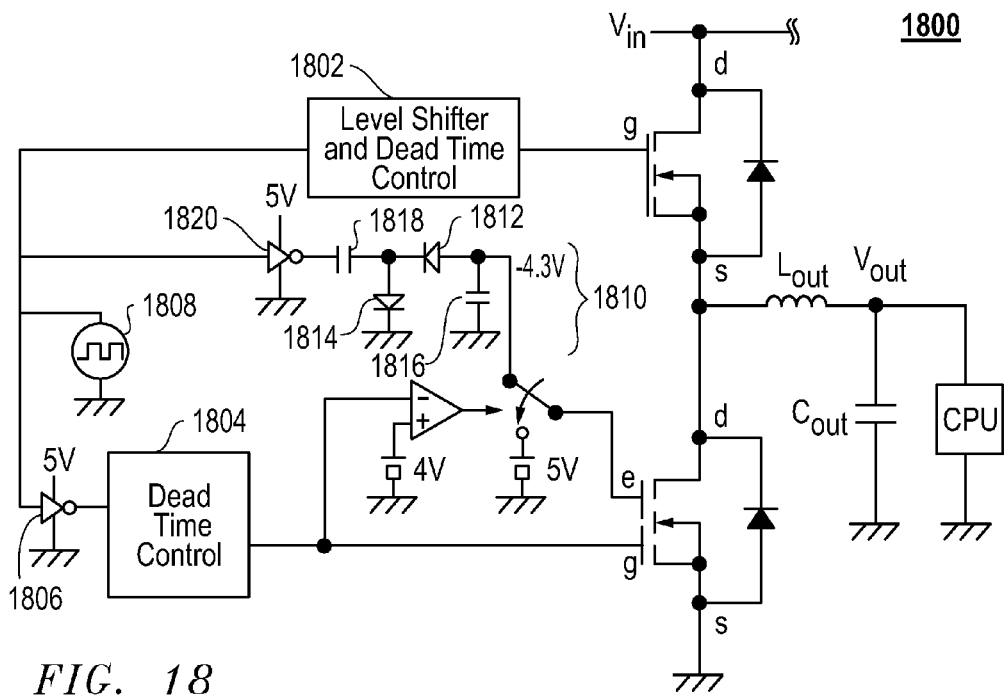
FIG. 18 is circuit diagram of a DC-DC converter.

FIG. 18 illustrates relevant components of one embodiment of the DC-DC converter shown within FIG. 15A. Many of the components in FIG. 15A are components that are not shown in the prior Figures, but are contained in the PWM circuit 106. More particularly, FIG. 18 shows a level shifter and dead time control circuit 1802, a dead time control circuit 1804, and inverter 1806 of the PWM circuit 106. Additionally, a square wave generator 1808 of PWM circuit 106 is also shown. Square wave generator 1808 generates a square wave that is provided to level shifter and dead time control circuit 1802 and the series combination of inverter 1806 and dead time control circuit 1804, which in turn generate the complementary high-side and low-side square waves, respectively, described above.

FIG. 18 additionally shows a source 1810 that generates first voltage V11. As shown, source 1810 includes diode 1812 coupled between diode 1814 and capacitor 1816. Additionally, a capacitor 1818 is coupled between diode 1814 and inverter 1820 as shown. An input to inverter 1820 is coupled to the square wave output provided by generator 1808. Source 1810 generates a constant first voltage Vl11=−4.3 volts for the trench electrode control circuit. It is noted the trench electrode control circuits shown within FIGS. 16A and 16B may take form in the trench element control circuit shown within FIG. 18.

Additional Devices Using the New Trench MOSFET

Figure 19:
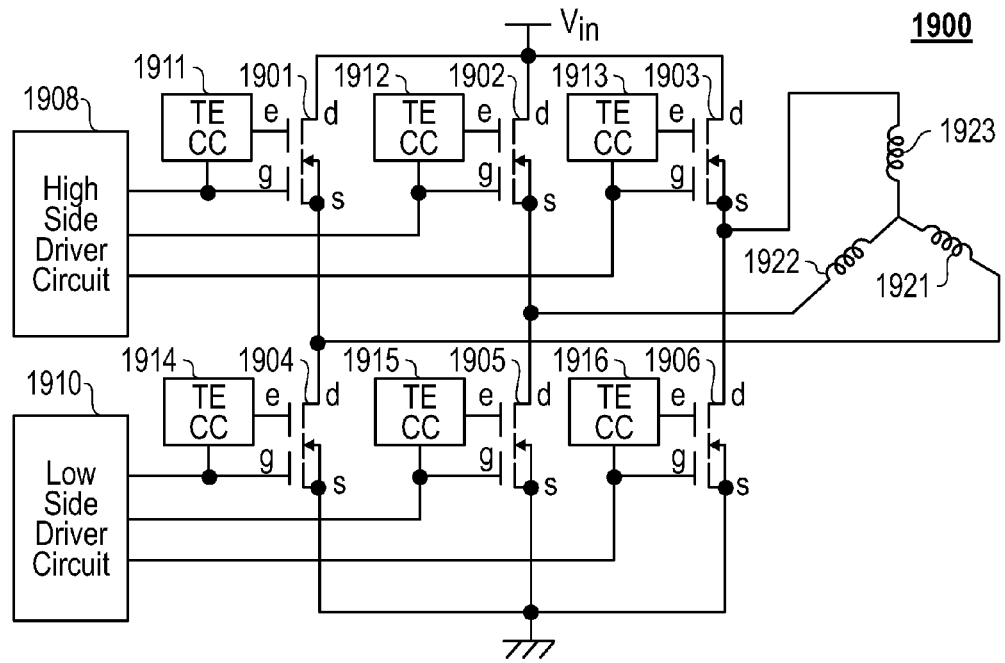
FIG. 19 is a schematic diagram of an example brushless motor driver.

The foregoing describes use of a trench MOSFET of FIGS. 3 and 4 in example non-isolated, DC-DC converters. The trench MOSFET can be employed in other devices. FIG. 19 is a schematic diagram of an example brushless motor driver 1900 employing trench MOSFETS like that shown in FIGS. 3 and 4. Driver 1900 includes high-side transistors 1901-1903 coupled to respective low-side transistors 1904-1906, each of which may take form in the trench MOSFET shown within FIGS. 3 and 4. Trench element control circuits (TECC) 1911-1913 are coupled to and control high-side transistors 1901-1903, while trench electrode control circuits 1914-1916 are coupled to and control low-side transistors 1904-1906, respectively. The trench electrode control circuits 1911-1916 may take form in the trench electrode control circuits shown in FIG. 14 or 17C. These trench electrode control circuits operate to reduce the conduction and switching losses transistors 1901-1906.

High side driver circuit 1908 generates square waves that drive respective gates of high-side transistors 1901-1903. Likewise, low-side driver circuit 1910 generates square waves that drive respective gates low-side transistors 1904-1906. The duty cycles of the square waves generated by the high-side driver 1908 and low-side driver 1910 may be controlled based upon inputs thereto. Like the trench element control circuits shown within FIG. 14 or 17C, each of the trench element control circuits 1911-1916 controls the voltage applied to the trench elements e of transistors 1901-1906, respectively, based on the voltage at the gates g of transistors 1901-1906. For example, trench element control circuits 1911-1916 may apply a first voltage or a second voltage to trench elements e of transistors 1901-1906, respectively. The first voltage applied to elements e of transistors 1901-1903 may differ from the first voltage applied to elements e of transistors 1904-1906, and the second voltage applied to elements e of transistors 1901-1903 may differ from the second voltage applied to elements e of transistors 1904-1906. The first voltage is greater than the second voltage. The voltage applied to element e depends on the voltage at gate g. For example, when the voltage at gate g of transistors 1901-1906, respectively, is less than the threshold voltage Vt of transistors 1901-1906, trench element control circuits 1911-1916 may apply the second voltage to trench elements e of transistors 1901-1906, respectively. And when the voltage at gate g transistors 1901-1906, respectively, is greater than the threshold voltage Vt of transistors 1901-1906, trench element control circuits 1911-1916 may apply the first voltage to trench elements e of transistors 1901-1906, respectively. In this fashion, trench element control circuits 1911-1916 can reduce the conduction and switching losses of transistors 1901-1906, respectively. Ultimately, transistors 1901-1906 coils 1921-1923 via nodes U, V, and W. Coils 1921-1923 generate a 3-phase rotating magnetic field that moves a motor rotor (not shown).

Figure 20:
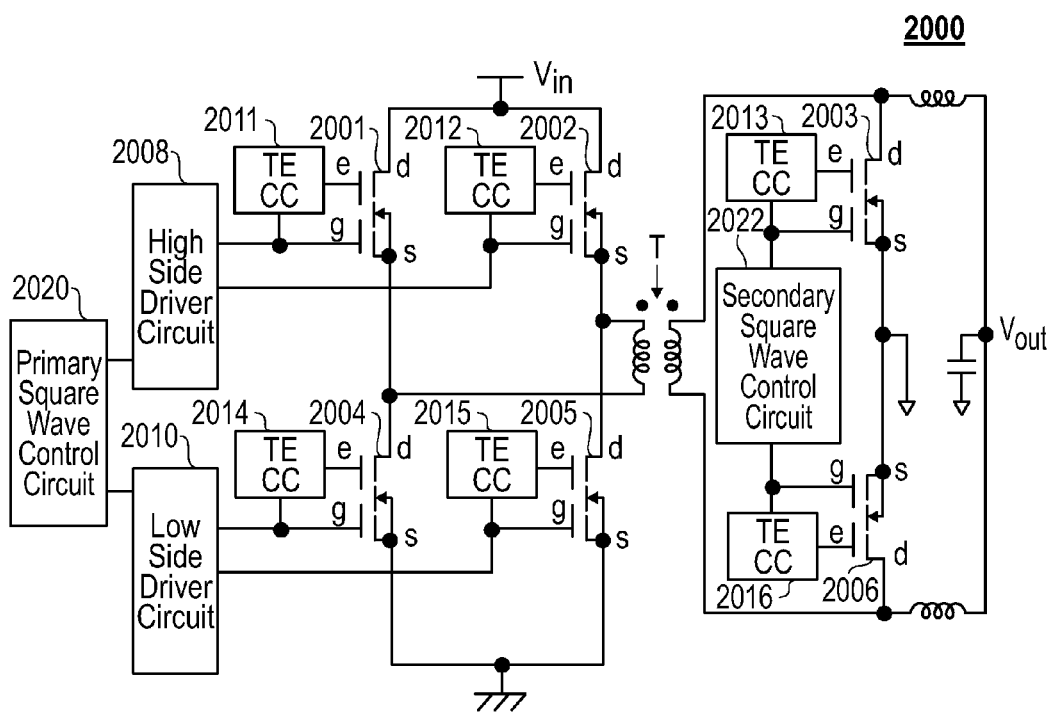
FIG. 20 is a schematic diagram of an example isolated DC-DC converter

FIG. 20 is a schematic diagram of an example isolated DC-DC converter employing trench MOSFETS like that shown within FIGS. 3 and 4. Unlike DC-DC converters described above, the example isolated DC-DC converter 2000 shown within FIG. 20 separates the input voltage Vin from the output voltage Vout using a transformer T. Converter 200 has full bridge driver in a primary driving system and synchronous switching for a secondary system.

Convertor 2000 includes high-side transistors 2001 and 2002 coupled to respective low-side transistors 2004 and 2005, each of which may take form in the trench MOSFET shown within FIGS. 3 and 4. Trench element control circuits (TECC) 2011-2012 are coupled to and control high-side transistors 2001 and 2002, while trench electrode control circuits 2014-2015 are coupled to and control low-side transistors 2004 and 2005, respectively. Synchronous switching transistors 2003 and 2006 take form in the trench MOSFETs shown within FIGS. 3 and 4. TECC 2013 and 2016 are coupled to and control synchronous switching. The trench electrode control circuits 2011-2016 may take form in the trench electrode control circuits shown in FIG. 14 or 17C. These trench electrode control circuits operate to reduce the conduction and switching losses in transistors 2001-2006.

High side driver circuit 2008 generates square waves that drive respective gates of high-side transistors 2001 and 2002. Likewise, low-side driver circuit 2010 generates square waves that drive respective gates low-side transistors 2004 and 2005. The duty cycles of these square waves generated by the high-side driver 2008 and low-side driver 2010 may be controlled based upon inputs provided by primary square wave control circuit 2020. A secondary square wave control circuit generates square waves that drive respective gates of transistors 2003 and 2006.

Like the trench element control circuits shown within FIG. 14 or 17C, each of the trench element control circuits 2011-2016 controls the voltage applied to the trench elements e of transistors 2001-2006, respectively, based on the voltage at the gates g of transistors 2001-2006. For example, trench element control circuits 2011-2016 may apply a first voltage or a second voltage to trench elements e of transistors 2001-2006, respectively. The first voltage is greater than the second voltage. The voltage applied to element e depends on the voltage at gate g. For example, when the voltage at gate g of transistors 2001-2006, respectively, is less than the threshold voltage Vt of transistors 2001-2006, trench element control circuits 2011-2016 may apply the second voltage to trench elements e of transistors 2001-2006, respectively. And when the voltage at gate g transistors 2001-2006, respectively, is greater than the threshold voltage Vt of transistors 2001-2006, trench element control circuits 2011-2016 may apply the first voltage to trench elements e of transistors 2001-2006, respectively. In this fashion, trench element control circuits 2011-2016 can reduce the conduction and switching losses of transistors 2001-2006, respectively.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method comprising:
   a circuit generating complementary high-side and low-side square waves with a dead time between pulses of the high-side and low-side square waves;
   a high-side transistor conducting current to an inductor during the pulse of the high-side square wave, wherein the high-side transistor comprises a trench with a gate and a conductive element contained therein, a source, and a drain, wherein the conductive element is isolated from the source, the gate, and the drain by an insulating material;
   a low-side transistor conducting current to the inductor during the pulse of the low-side square wave
   wherein voltage on the source varies independently of voltage on the conductive element.

2. The method of claim 1 further comprising:
   the low-side transistor conducting a forwarding current to the inductor during the dead time between pulses of the high-side and low-side square waves;
   the low-side transistor conducting a reverse recovery current at the end of the dead time between pulses of the high-side and low-side square waves;
   the high-side transistor conducting some the reverse recovery current via a capacitance between the drain and the conductive element.

3. The method of claim 1 wherein the low-side transistor comprises a trench with a gate and a conductive element contained therein, a source, and a drain, wherein the conductive element of the low-side transistor is separated from the drain of the low-side transistor by an insulating layer thereby creating a capacitance therebetween.

4. The method of claim 3 wherein the conductive element of the low-side transistor and the conductive element of the high-side transistor are connected to a ground node.

5. A method comprising:
   a circuit generating complementary high-side and low-side square waves with a dead time between pulses of the high-side and low-side square waves;
   a high-side transistor conducting current to an inductor during the pulse of the high-side square wave;
   a low-side transistor conducting current to the inductor during the pulse of the low-side square wave, wherein the low-side transistor comprises a trench with a gate and a conductive element contained therein, a source, and a drain, wherein the conductive element is separated from the source and the gate by an insulating material;
   wherein the low-side transistor comprises a gate terminal connected to the gate, a conductive element terminal connected to the conductive element, source terminal connected to the source, and a drain terminal connected to the drain.

6. The method of claim 5 further comprising a control circuit controlling voltage on the conductive element as a function of voltage on the gate.

7. The method of claim 5 further comprising a control circuit applying one of a plurality of voltages to the conductive element based on a voltage on the gate.

8. The method claim 5 further comprising a control circuit coupling the conductive element to a first voltage while the low-side transistor is in an active state.

9. The method claim 8 further comprising the control circuit coupling the conductive element to a second voltage while the low-side transistor is in an inactive state, and wherein the first voltage is different than the second voltage.

10. The method claim 9 further comprising the control circuit decoupling the conductive element from the first voltage as the low-side transistor transitions from the active state to the inactive state, and the control circuit coupling the conductive element to the second voltage as the low-side transistor transitions from the active state to the inactive state.

11. The method claim 9 further comprising the control circuit decoupling the conductive element from the second voltage as the low-side transistor transitions from the inactive state to the active state, and the control circuit coupling the conductive element to the first voltage as the low-side transistor transitions from the inactive state to the active state.

12. The method of claim 3 wherein the conductive element of the low-side transistor is connected to ground via a resistor, and the conductive element of the high-side transistor is connected to a ground node.

13. The method of claim 1 further comprising a control circuit controlling voltage on the conductive element as a function of voltage on the gate.

14. The method of claim 13 wherein the low-side transistor comprises a trench with a gate and a conductive element contained therein, a source, and a drain, wherein the conductive element of the low-side transistor is separated from the drain of the low-side transistor by an insulating layer.

15. The method of claim 14 wherein the conductive element of the low-side transistor is connected to ground via a resistor.

16. The method of claim 6 wherein the high-side transistor comprises a trench with a gate and a conductive element contained therein, a source, and a drain, wherein the conductive element of the high-side transistor is separated from the drain of the high-side transistor by an insulating layer.

17. The method of claim 16 further comprising another control circuit controlling voltage on the conductive element of the high-side transistor as a function of voltage on the gate of the high-side transistor.

\* \* \* \* \*